US006853180B2

(12) United States Patent
Neumann et al.

(10) Patent No.: US 6,853,180 B2
(45) Date of Patent: Feb. 8, 2005

(54) MEASURED VALUE ACQUISITION AND PROCESSING UNIT FOR SMALL MEASURING SIGNALS

(75) Inventors: Siegfried Neumann, Kümmersbruck (DE); Klaus Windsheimer, Spalt (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/471,460

(22) PCT Filed: Mar. 6, 2002

(86) PCT No.: PCT/DE02/00808

§ 371 (c)(1),
(2), (4) Date: Sep. 12, 2003

(87) PCT Pub. No.: WO02/073221

PCT Pub. Date: Sep. 19, 2002

(65) Prior Publication Data

US 2004/0095146 A1 May 20, 2004

(30) Foreign Application Priority Data

Mar. 14, 2001 (DE) .......................... 101 12 304

(51) Int. Cl.⁷ ................................. G01R 7/00
(52) U.S. Cl. ......................... 324/142; 702/60
(58) Field of Search ................ 324/140, 120, 324/143, 132; 702/60–62

(56) References Cited

U.S. PATENT DOCUMENTS 5,128,611 A * 7/1992 Konrad ..................... 324/142
6,392,402 B1 * 5/2002 Swift ......................... 324/132

FOREIGN PATENT DOCUMENTS

| DE | 37 00 368 C1 | 6/1988 | |
| DE | 44 34 318 A1 | 3/1996 | |
| GB | A-1 575 148 | * 9/1980 | ........... G01R/21/00 |

* cited by examiner

*Primary Examiner*—Evan Pert
*Assistant Examiner*—Paresh Patel
(74) *Attorney, Agent, or Firm*—Harness, Dickey & Pierce, P.L.C.

(57) ABSTRACT

The invention relates to a measured value acquisition and processing unit (5) that facilitates the acquisition and processing of very small measuring signals in the range of interfering signals, such as, for example, noise, spillovers, etc. This means that the useful values to be detected usually contain interfering portions. The inventive measured value acquisition and processing unit (5) separately acquires these interfering portions by means of a switch element (10) disposed in the area of feed of the measured signals by means of which the measuring circuit is short-circuited in such a manner that the measured signal is not coupled in but only interfering signals that might occur in the measuring circuit are detected. The inventive method provides a large range of dynamic ratio for the detection of measured values at low costs.

6 Claims, 2 Drawing Sheets

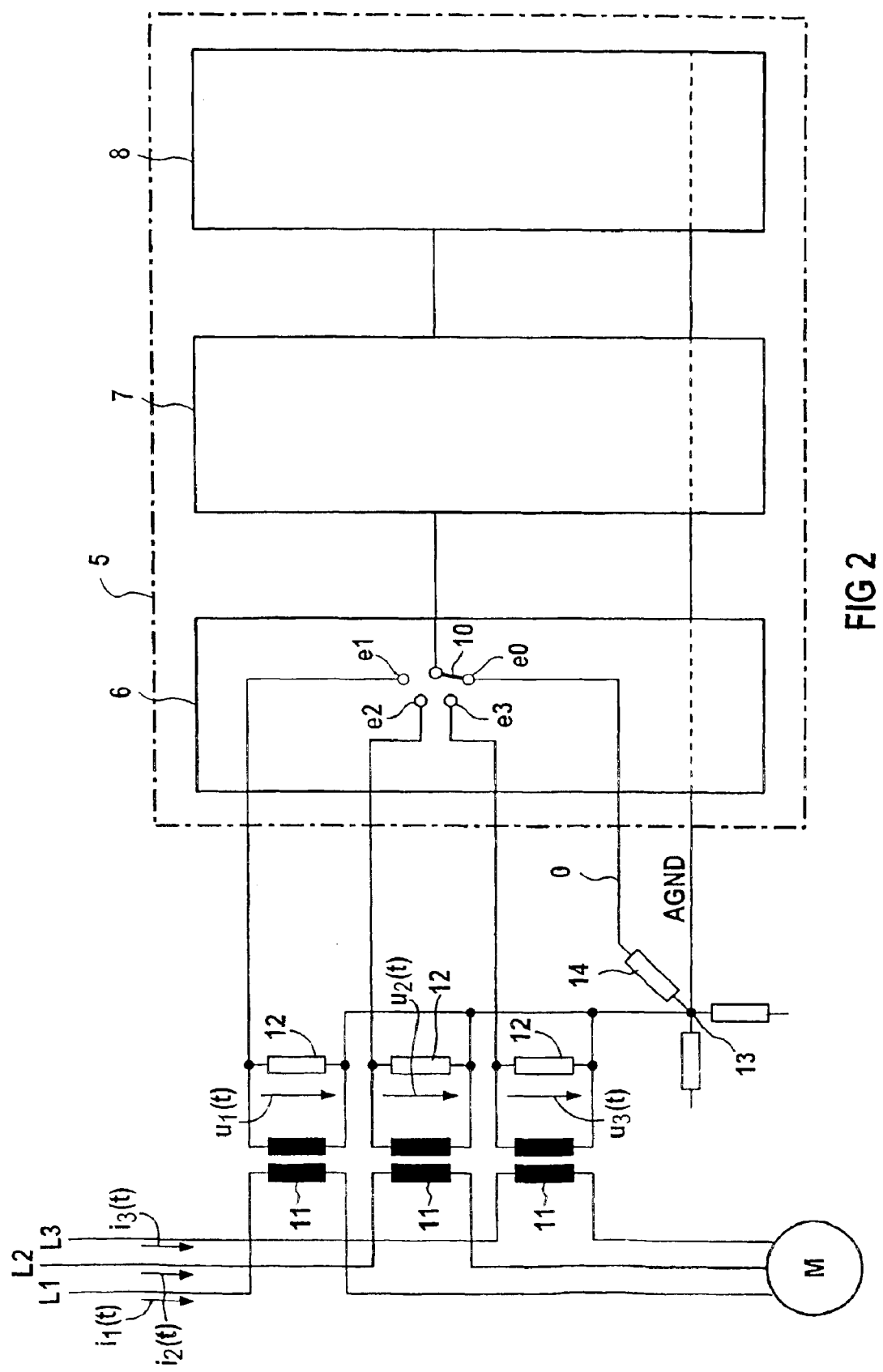

MEASURED VALUE ACQUISITION AND PROCESSING UNIT FOR SMALL MEASURING SIGNALS

This application is the national phase under 35 U.S.C. § 371 of PCT International Application No. PCT/DE02/00908 which has an International filing date of Mar. 6, 2002, which designated the United States of America and which claims priority on German Patent Application number DE 101 12 304.3 filed Mar. 14, 2001, the entire contents of which are hereby incorporated herein by reference.

FIELD OF THE INVENTION

The present invention generally relates to a measurement value detection and processing unit for small signals, which is formed by a measurement circuit which has at least one sampling unit, an A/D converter and a digital signal processing device. The sampling unit may be used for sampling a measurement signal which is to be detected, and the A/D converter may be provided for digitization of the sample values. The digital signal processing device may be used for processing of the digitized sample values which, in addition to the useful value to be detected from the measurement signal, may have interference components as a consequence of interference signals, for example noise and injected inputs into the measurement circuit.

BACKGROUND OF THE INVENTION

An example of the accurate required detection of measurement signals is electronic motor protection, in which the motor currents are used as input variables to a thermal motor model. In order to minimize the number of variants of motor protective devices, motor protection with a wide adjustment range of, for example, 1:10 is required, with this indicating the ratio of the minimum rated current to the maximum rated current of the motor. Furthermore, it is necessary to take account of the fact that the starting current of the motor may be ten times the rated current, so that a dynamic range of 1:100 is required for the analogue/digital converter.

Additionally, current measurement during operation is used to detect whether the motor is switched on or off correctly. On the basis of practical experience, it can be assumed that, when the motor is switched off, the measured current is less than 20% of the motor rated current. This necessitates an increase in the dynamic range to 1:500.

In addition to the analog/digital converter, an appropriate current sensor is also required for detection of the current, and has to cover the same dynamic range. Furthermore, there is a requirement for a low cost current sensor, which can be achieved with a small current sensor with a small output signal. However, this results in the problem that the small output signals such as these may be from the same range as interference signals, such as noise, crosstalk etc, while it is nevertheless necessary to distinguish between the motor current as the actual useful signal and corrupting interference signals.

SUMMARY OF THE INVENTION

The present invention is thus based on an object of providing a measurement value detection and processing unit that allows measurement variables with a wide dynamic range to be detected at low cost.

An object of the present invention may be achieved by a measurement value detection and processing unit having a switching element is provided, by way of which an electrical connection can be produced between the measurement circuit and its reference ground potential AGND in which, when no measurement signal is being injected into the measurement circuit, only any existing interference signals occur in the measurement circuit and are detected by it. The digital signal processing device is also used for numerical compensation, in which the useful values of the measurement signal which are subject to interference components are compensated for by way of interference components which are detected in an isolated manner at relevant times.

An advantage of this measurement value detection and processing unit according to the invention is that the interference components which corrupt the useful signal are measured in an isolated, simple manner. If both measurements, that is to say on the one hand the measurement for detection of the useful value and on the other hand that for detection of the interference component, are carried out virtually at the same time or with a negligibly short time interval, then the interference component in the detected useful value can be compensated for in the digital signal processing.

It has been found advantageous for detection of load currents with a three phase connection, for example detection of motor currents, for the sampling unit to have a multiplexer which is used for time division multiplex sampling of three measurement signals which are obtained from current sensors.

One advantageous embodiment is for the current sensors to be in the form of current transformers, whose measurement signals on the output side are at a common reference ground potential, and for four inputs to be available in the multiplexer for coupling of the measurement signals and of the reference ground potential.

It is also advantageous for the switching element to be implemented in the multiplexer so that it produces the short circuit connection in the measurement circuit to the reference ground potential.

Further scope of applicability of the present invention will become apparent from the detailed description given hereinafter. However, it should be understood that the detailed description and specific examples, while indicating exemplary embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 shows a further embodiment according to the invention of the measurement value detection and processing unit for detection of two or more measurement variables, for example the currents of a motor.

DETAILED DESCRIPTION OF THE EXEMPLARY EMBODIMENTS

Figure 1:
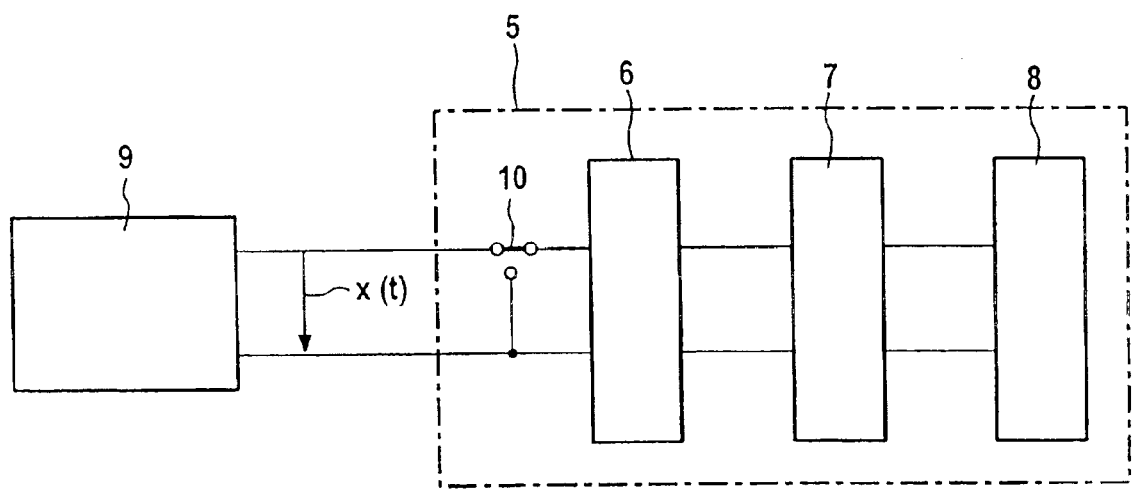
FIG. 1 shows a measurement value detection and processing unit according to the invention for detection of a measurement signal.

FIG. 1 shows a measurement value detection and processing unit 5 according to the invention. This is formed by a measurement circuit which has at least one sampling unit 6, an analog/digital converter 7 and a digital signal processing device 8. In this case, the sampler unit 6 is used for sampling a measurement signal which is to be detected and varies with time, x(t), which, for example, may be a current, a voltage or a temperature and is supplied from a sensor 9. After digitization of the analogue sample values in the analogue/digital converter 7, the digital sample values are processed further in the digital signal processing device 8. In addition to the useful value of the measurement signal x(t) to be detected, the digital sample values contain interference components as a consequence of interference signals, for example noise and injected inputs into the measurement circuit. In order to detect these interference components in an isolated manner, the input of the measurement signal x(t) is canceled out by switching the switching element 10, such that only any interference signals which are present occur in the measurement circuit, and are detected by it. In this case, it should be noted that the interference components must be detected at times relevant to the detected useful values, that is to say with as little time offset as possible. With regard to the location of the short circuit connection, it can be confirmed that the detection of all the interference signals becomes more comprehensive and more accurate the closer the switching connection is to the point at which the measurement signal x(t) is injected into the measurement value detection and processing unit 5, for example between the input terminals of the measurement signal x(t).

The digital signal processing device 8 is used for numerical compensation, in which the useful values of the measurement signal x(t) which are subject to interference components are compensated for by way of interference components which are detected in an isolated manner at relevant times.

FIG. 2 shows a further embodiment of a measurement value detection and processing unit according to an embodiment of the present invention. In this case, the thermal load on a motor M is detected by measuring the three phase current load in the phase conductors L1, L2, L3, in which current transformers 11 are connected as the current sensors, whose secondary winding is connected to a resistor 12 as the burden. In consequence, voltage $u_1(t)$, $u_2(t)$, $U_3(t)$ which is proportional to the respectively detected phase current: $i_1(t)$, $i_2(t)$, $i_3(t)$ is produced across the three resistors 12, with t denoting the variable "time". The three resistors 12 are connected together at a common circuit point 13 which is at a predetermined reference ground potential, in this case annotated AGND. The voltages $u_1(t)$, $u_2(t)$, $u_3(t)$ which are produced across the resistors 12 with respect to this reference ground potential AGND are supplied to inputs of a measurement and processing unit 5. This unit 5 has a measurement circuit with a multiplexer in a sampler unit 6, which has inputs $e_1$, $e_2$, $e_3$, $e_0$, an analogue/digital converter 7 and a digital signal processing device 8. Via its inputs $e_1$, $e_2$, $e_3$, the multiplexer successively taps off the voltages $u_1(t)$, $u_2(t)$, $u_3(t)$ in a predetermined multiplexing sequence, for example 1, 2, 3. The rest of the detection process and processing are then carried out by the analogue/digital converter 7 and the digital signal processing device 8, with the common return line of the measurement circuit being connected to the circuit point 13 at the reference ground potential AGND. The multiplexer has a further input $e_0$, which is optionally linked to the reference ground potential AGND at the circuit point 13, within or outside the measurement value detection and processing unit 5, via an additional measurement channel having a resistor 14. The resistor 14 corresponds to the resistor 12, which was mentioned above and is used as the burden.

The measurement value detection and processing unit according to the present invention for detection of the thermal load in a motor, for example, is based on the requirement that the current transformers 11 must be cheap and correspondingly small. This can be achieved by way of current sensors 11 with correspondingly small measurement signals x(t), whose magnitudes are in the same range as interference signals, for example noise and crosstalk. In this case, interference signals which are injected in the area of the current sensors 11 can be compensated for with little complexity by way of appropriate circuitry.

The present invention has the aim of compensating for the injected interference signals which occur in the measurement value detection and processing unit 5. This assumes that the interference signals which are added to the equivalent current measurement values $u_1(t)$, $u_2(t)$, $u_3(t)$ can be measured separately with a small time offset, so that the accurate useful values which are required for calculation of the thermal load can be determined by means of numerical compensation, with any interference components being eliminated.

The additional input $e_0$, to which an additional measurement channel can be excluded by the resistor 14 which is connected to the reference ground potential AGND, is used for detection of the separate interference components $i_0$. An additional phase 0, that is to say an additional measurement channel, is inserted in the multiplexing sequence 1, 2, 3 mentioned above. The return line at the reference ground potential AGND can be connected by way of the multiplexer, that is to say its switching element 10, via the phase 0 with the resistor 14, to the measurement circuit. In this case, the connection to form one of the inputs $e_1$, $e_2$, $e_3$ is at the same time interrupted, so that no measurement voltage $u_1(t)$, $U_2(t)$, $u_3(t)$ is injected, with only interference signals i0 occurring and being detected in the measurement circuit.

The respective sample values which are detected in each of the phases 1, 2, 3, 0 are passed on from the multiplexer 6 to the analog/digital converter 7 for digitization, and are finally processed in the digital signal processing device 8. The digital signal processing device 8 is in the form of a microprocessor, in which the root mean square values of the phase currents are calculated in order to determine the thermal load. In the ideal case, that is to say when no interference signals i0 occur, the root mean square value can be determined in a conventional manner by a digital measurement system for root mean square value measurement, using the following equation:

$$I_{RMSI} = \sqrt{\frac{1}{N} \cdot \sum_{n=1}^{N} i1[n]^2}$$

In the present case, taking into account the influence of the interference signals i0, the root mean square value of the current is determined according to the invention as follows:

$$I_{RMSI} = \sqrt{\frac{1}{N} \cdot \sum_{n=1}^{N} i1[n]^2 - \sum_{n=1}^{N} i0[n]^2}$$

Definition:
$I_{RMS}$ Root mean square value of the current
$I_{RMSI}$ Root mean square value of the current in L1
I[n] Digital sample value of the output of the A/D converter
i1[n] Digital sample value of the output of the A/D converter in the multiplexer position L1 i0[n] Digital sample value of the output of the A/D converter with the multiplexer position via a resistor 14 at analogue ground N Number of sample values for root mean square value calculation Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A measurement value detection and processing unit comprising:
   - a measurement circuit which has at least one sampling unit, an analog/digital converter and a digital signal processing device,
   - the sampling unit for sampling a measurement signal which is to be detected,
   - the analog/digital converter for digitizing the sample values,
   - the digital signal processing device for processing the digitized sample values,
   - a switching unit, by way of which an electrical connection can be produced between the measurement circuit and a reference ground potential AGND, in which, when no measurement signal is being injected into the measurement circuit, only existing interference signals occurring in the measurement circuit are detected thereby,
   - the digital signal processing device for numerical compensation, in which useful values of the measurement signal which are subject to interference components are compensated for by way of interference components which are detected in an isolated manner at relevant times, and
   - the measurement value detection and processing unit determines the root mean square value $I_{RMS}$ of a current $i_1(t)$, to which a proportional voltage $u_1(t)$ corresponds, using the formula:

$$I_{RMS1} = \sqrt{\frac{1}{N} \cdot \sum_{n=1}^{N} i1[n]^2 - \sum_{n=1}^{N} i0[n]^2}$$

with the following definitions:

i1[n] Digital sample value of the current $i_1(t)$ at the output of the A/D converter, i0[n] Digital sample value $i_1(t)$ at the output of the A/D converter with electrical connection of the measurement circuit to the reference ground potential AGND, and N Number of sample values for root mean square value calculation.

2. The unit as claimed in claim 1, wherein the sampling unit has a multiplexer which is used for time division multiplex sampling of three measurement signals which are supplied from current sensors.

3. The unit as claimed in claim 2, wherein the current sensors are in the form of current transformers, where measurement signals on the output side are at a common reference ground potential AGND, and in that four inputs $e_0$, $e_1$, $e_2$, $e_3$ are provided in the multiplexer, for coupling of the measurement signals and of an additional measurement channel.

4. The unit as claimed in claim 1, wherein the switching element is provided in the multiplexer and produces a short circuit connection in the measurement circuit to the reference ground potential AGND.

5. The unit as claimed in claim 2, wherein the switching element is provided in the multiplexer and produces a short circuit connection in the measurement circuit to the reference ground potential AGND.

6. The unit as claimed in claim 3, wherein the switching element is provided in the multiplexer and produces a short circuit connection in the measurement circuit to the reference ground potential AGND.

* * * * *